United States Patent [19]

Tingerthal et al.

[11] Patent Number: 5,514,449
[45] Date of Patent: May 7, 1996

[54] MULTI-CHIP SUBSTRATE

[75] Inventors: Jeanne M. Tingerthal, Ramsey, Minn.;
Gregory P. Dado, Dane, Wis.

[73] Assignee: Minnesota Mining and Manufacturing Company, St. Paul, Minn.

[21] Appl. No.: 803,087

[22] Filed: Dec. 5, 1991

Related U.S. Application Data

[63] Continuation-in-part of Ser. No. 562,516, Jul. 27, 1990, Pat. No. 5,102,718.

[51] Int. Cl.$^6$ ........................................... B32B 3/00
[52] U.S. Cl. ................. 428/195; 428/209; 428/411.1; 428/419; 428/435; 428/457; 428/458; 428/461; 428/473.5; 428/901
[58] Field of Search ............................ 428/209, 195, 428/458, 461, 419, 473.5, 457, 435, 901, 411.1; 427/96, 407.1; 361/397, 414

[56] References Cited

U.S. PATENT DOCUMENTS

| | | | |
|---|---|---|---|
| 3,933,745 | 1/1976 | Bargain | 524/359 |
| 4,543,295 | 9/1985 | St. Clair | 428/458 |
| 4,681,795 | 7/1987 | Tuckerman | 428/209 |
| 4,702,792 | 10/1987 | Chow et al. | 156/628 |
| 4,770,897 | 9/1988 | Wu | 437/228 |
| 4,810,332 | 3/1989 | Pan | 204/15 |
| 5,102,718 | 4/1992 | Tingerthal et al. | 428/209 |

Primary Examiner—Nasser Ahmad
Attorney, Agent, or Firm—Gary L. Griswold; Walter N. Kirn; Darla P. Neaveill

[57] ABSTRACT

An interconnect substrate comprising a metal-polymer composite incorporating microelectronic circuitry, which interconnect substrate is characterized by the feature that the polymer comprises alternating layers of thermoset and thermoplastic resins, said thermoplastic resins being resistant to the highest temperature to which the interconnect substrate may be heated, said thermoset resins being selected from the group consisting of bismaleimides, thermosetting polyimides, benzocyclobutenes and cyanate esters, said thermoplastic resin being selected from the group consisting of preimidized polyetherimides, and polyesters including polyacrylates, polyamides, polyvinylacetals, and phenoxy resins, said substrate having a durable base.

8 Claims, 1 Drawing Sheet

MULTI-CHIP SUBSTRATE

This application is a continuation-in-part of U.S. Ser. No. 07/562,516, filed on Jul. 27, 1990, now U.S. Pat. No. 5,102,718.

BACKGROUND OF THE INVENTION

1. Field of the Invention

The invention relates to interconnect substrates such as a multi-chip substrate (MCS) by which a plurality of integrated chips can be interconnected into a multi-chip module (MCM).

2. Description of the Related Art

It has been long known that, by mounting a plurality of integrated chips on an interconnect substrate such as an MCS, the shorter paths between the chips result in faster switching. An interconnect substrate that includes a multi-level metal-polymer composite is described in U.S. Pat. No. 4,810,332, (Pan), incorporated herein by reference, which states that in copper/polyimide interconnects, the copper which is in contact with the polyimide will discolor indicating its oxidation or corrosion. Therefore an overconnect is provided to protect the copper from oxidation and enhance polyimide adhesion to copper. The protective coating can be nickel, chromium or other materials capable of being electroplated.

U.S. Pat. No. 4,702,792 (Chow et al.) discloses an interconnect substrate which is made using a polymeric photoresist which is patterned to form openings. Conductive material is then applied to fill the openings, and excess is removed by polishing to expose at least the exterior major surface of the polymeric material. The surface then consists of conductive lines and patterns surrounded by polymeric material. Preferred polymeric photoresists have a $T_g$ of at least 150° C. and includes baked novolaks and polyimides.

U.S. Pat. No. 4,681,795 (Tuckerman) discloses planarizing the surface of each layer of a multi-level substrate by melting the metal using a pulsed laser prior to the patterning. As polyimides may be damaged by exposure to the molten metal, it is suggested that the dielectric be pure $SiO_2$.

U.S. Pat. No. 4,770,897 (Wu) discloses the enhancing of adhesion between the copper and the polyimide of an interconnect substrate. This is done by completely sealing the copper in a cured dielectric sublayer having been applied as two materials, both preferably photosensitive polyimides that are cured in a vacuum at temperatures of 300° C. or more.

The present inventors have now discovered that an interconnect substrate such as an MCS comprising a metal-polymer composite incorporating microelectronic circuitry like that described in the Pan patent, supra, can be made without any protective overcoating such as nickel or chromium when alternate layers of thermoset and thermoplastic resins which are free from copper reactive groups.

SUMMARY OF THE INVENTION

The present invention provides an interconnect substrate comprising a metal-polymer composite incorporating microelectronic circuitry, which interconnect substrate is characterized by the feature that the polymer comprises alternating layers of thermoset and thermoplastic resins, said thermoplastic resins being resistant to the highest temperature to which the interconnect substrate may be heated, said thermoset resins being selected from the group consisting of bismaleimides, thermosetting polyimides, benzocyclobutenes and cyanate esters, said thermoplastic resin being selected from the group consisting of preimidized polyetherimides, polyesters including polyacrylates, polyamides, polyvinylacetals, and phenoxy resins, said substrate having a durable base.

Preferably, both the thermoset resin and the thermoplastic resin are selected to have low water absorption, thus minimizing changes in electrical properties due to changes in water content of the novel interconnect substrate.

As used herein, the following terms have these meanings.

1) The term "electrically conductive metal features" means microelectric circuitry.

2) The term "thermoset resin" means an infusible resin that cannot be dissolved in an solvent.

3) The term "infusible" means that the resin does not melt when heated in an inert atmosphere.

4) The term "thermoplastic resin" means that the resin is fusible and can be dissolved, even though it may be insoluble in many common organic solvents, as are most polyimide resins.

5) The expression "groups that are reactive with copper" means that groups are present which, when in contact with copper, will cause oxidation or corrosion, typically by the formation of water.

DETAILED DESCRIPTION OF THE INVENTION

Figure 1:
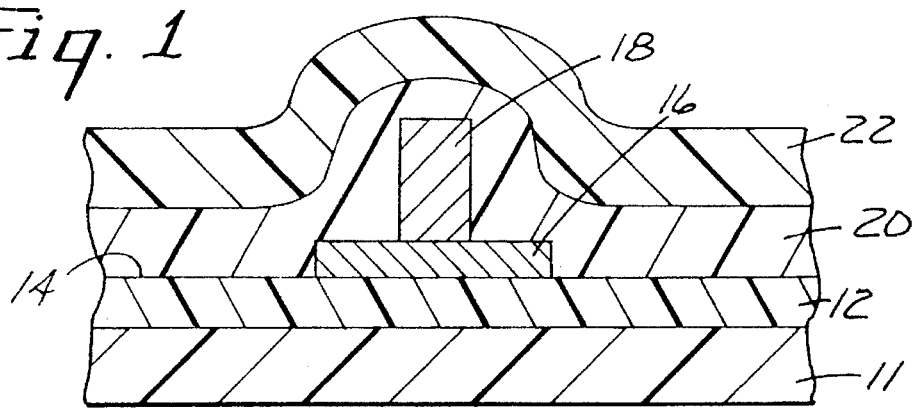
FIG. 1 is a schematic cross-section showing an intermediate stage in the construction of a first interconnect substrate.

Useful thermoplastic resins preferably have a $T_g$ of at least about 260° C. so that the novel interconnect substrate can resist soldering temperatures, thus permitting solder to be employed to attach microchips. Somewhat lower resistance to high temperatures is satisfactory when electrical connections are to be made without soldering, e.g., by means of die-attach conductive adhesives, but care should be taken to select the thermoplastic resin to be resistant to the highest temperature to which the novel interconnect substrate might be heated in use.

Classes of useful thermoplastic resins include preimidized polyimides such as those available as "Lenzing" P84 from Lenzing AG, "Matrimide" 5218, from Ciba-Geigy, and the polyetherimide "Ultem" 1000 from General Electric Corporation; polysulfones such as "Victrex" PES 4800P and "Victrex" PES5003P, available from International Chemical Industries Incorporated, and "Udel" P1700-NT11, available from Amoco Performance Products; phenoxy resins such as "PKHC" and "PKHH", available from Union Carbide Chemical Company, and polyesters such as "Dynopol" 206 from Huls America, polyarylates such as "Ardel" D100, available from Union Carbide; polyvinylbutyrals such as "SLEC BX-L", available from Sekisui Chemical Company, and "Butvar" B98, available from Monsanto Chemical Company; polyvinylformals, such as those available under the "Formvar" tradename from Monsanto, e.g., "Formvar" 5/95E and 6/95E.

Preferred thermoplastic resins that are substantially free from groups that react with copper and resist soldering temperatures are the preimidized polyimides such as "Lenzing" P84 from Lenzing AG and "Matrimide" 5218 from Ciba-Geigy. They have excellent machinability at ordinary room temperatures as well as good toughness and flexibility. They also have significantly lower moisture absorption than do thermoplastic polyimides formed in situ from a polyamic acid.

Thermosetting resins which are substantially free from groups that are reactive with copper, i.e., which result in corrosion of copper plating in the microelectric circuitry, and when cured are resistant to soldering temperatures, include bismaleimides such as "Compimide" 896 and 183 from Boots Technochemie and "Matrimide" 5292 from Ciba-Geigy; thermosetting polyimides such as "Thermid" FA7001 from National Starch; benzocyclobutenes such as XU13005.02 from Dow Chemical; and cyanate esters such as "AroCy M50" available from Hi-Tek Polymers, Jeffersontown, Ky. When resistance to soldering temperatures is not required, epoxy resins are useful.

Commercially available thermosetting resins of each of the aforementioned classes can be coated from solvents such as cyclohexanone to which preimidized polyimide thermoplastic resins are resistant. Thermosetting resins of each of those classes can be selected so that when crosslinked, they afford low moisture absorption, low dielectric constant, and good thermal and chemical resistance. Especially good in each of these respects are the bismaleimides and the cyanate esters.

Because thermoset resins cannot be dissolved, each layer of thermoplastic resin of the novel interconnect can be coated from any solvent in which it is soluble. On the other hand, the thermosetting resin (which cures to provide the above-mentioned thermoset resin) should be selected to permit it to be applied without damaging the underlying layer of thermoplastic resin. For example, when the thermosetting resin is to be applied from solution, the underlying thermoplastic resin should be resistant to the solvent.

In the novel interconnect substrate, layers of thermoset and thermoplastic resins can either alternate in adjacent levels, or each level can include both a layer of thermoset resin and a layer of thermoplastic resin. When each level of a multilayer interconnect substrate of the invention includes either a thermoset resin or a thermoplastic resin, each such resin preferably has good machinability to permit each level of the interconnect to be planarized mechanically, e.g., by being mechanically polished. On the other hand, when there is a layer of thermoset resin and a layer of thermoplastic resin in each level of a novel multi-level interconnect substrate, only the layer at the surface needs to be machinable. Because a thermoplastic resin usually has better machinability than do thermoset resins, the former preferably is located at the surface of each level. In efforts to date to make a multi-level interconnect substrate having both a thermoset resin and a thermoplastic resin in each level and the thermoplastic resin at the surface, some crazing of the thermoplastic resin has been experienced in the vicinity of the Cu features. Apparently, a little of the solvent for the thermoplastic resin is penetrating through the underlying thermoset layer at the Cu features and thus reaching the next layer of thermoplastic resin. Like Pan's interconnect substrate, that of the invention should have a durable base, preferably one that has a machinable face. Useful durable bases include a silicon wafer; ceramics such as alumina, silica, or titania; and ferrous metals such as stainless steel. A preferred base is a silicon wafer having a polymeric coating that is machinable, such as a preimidized polyimide resin, and so can be mechanically planarized to afford a smooth, planar surface on which to build a multilevel metal-polymer composite.

THE DRAWINGS

Figure 2:
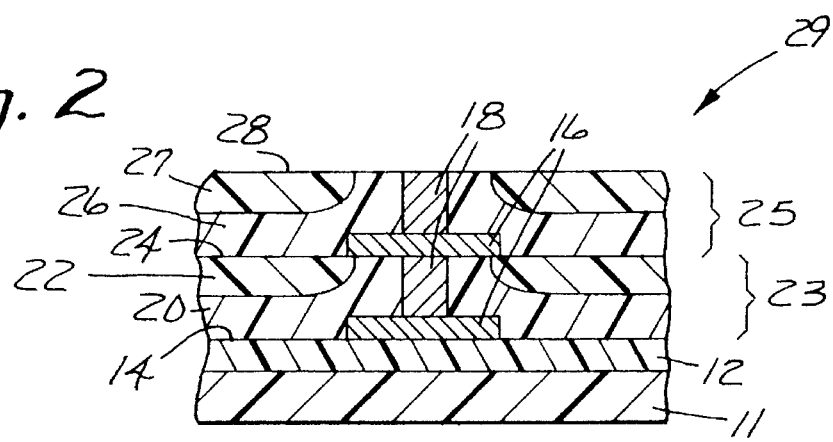
FIG. 2 is a schematic cross-section through the completed interconnect substrate of FIG. 1.

The invention may be more easily understood in reference to the drawings wherein FIG. 1 is a schematic cross-section showing an intermediate stage in the construction of a first interconnect substrate of the invention; FIG. 2 is a schematic cross-section through the completed interconnect substrate of FIG. 1 that includes a multilevel metal-polymer composite; and FIG. 3 is a schematic cross-section through a second interconnect substrate of the invention that also includes a multilevel metal-polymer composite.

Referring first to FIG. 1, a silicon wafer 11 has a thin layer 12 of polyimide resin that has been mechanically finished to have a planar surface 14 onto which has been built by known techniques a Cu signal layer 16 and a pillar or via 18. Over this has been coated a thermosetting resin which has been crosslinked to provide a first layer 20 of thermoset resin. Over the thermoset layer 20 has been coated a second layer of thermoplastic resin that has been dried to leave a thermoplastic layer 22. This has then been mechanically planarized to provide the first level 23 of a metal-polymer composite shown in FIG. 2. In doing so, some of the Cu of via 18 has been removed. Onto the planar surface 24 of the first level 23 has been constructed a second level 25 which (being identical in composition to the first level) includes a first layer 26 of thermoset resin and a second layer 27 of thermoplastic resin that has been mechanically planarized to a planar exterior surface 28, thus providing an interconnect substrate 29 that includes a 2-level metal-polymer composite.

Figure 3:
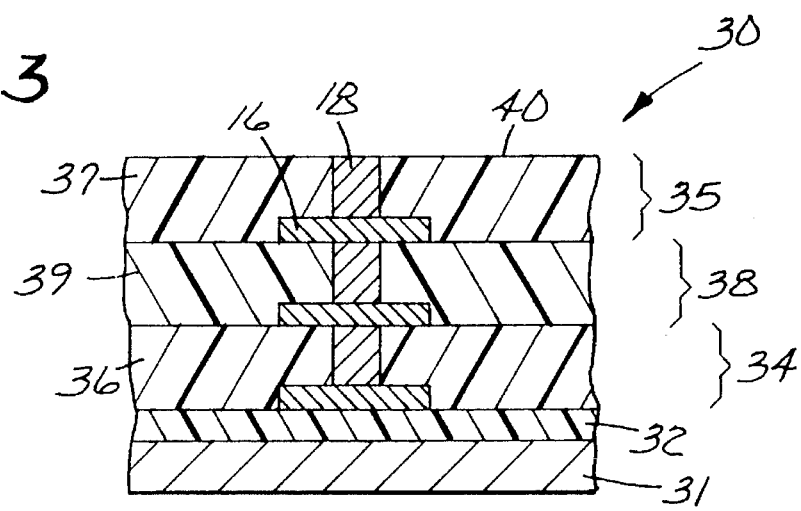
FIG. 3 is a schematic cross-section through a second interconnect substrate.

In FIG. 3 is shown an interconnect substrate 30 which includes a 3-level metal-polymer composite that has Cu signal layers 16 and vias 18 and has been built on a silicon wafer 31 having a thin layer 32 of polyimide resin. The first and third levels 34,35 are metal-polymer composites including layers 36,37, respectively, of thermoset resin while the intermediate or second level 38 is a metal-polymer composite including a layer 39 of thermoplastic resin. If desired, additional levels with alternating layers of thermoset and thermoplastic resins could be built onto the exposed planar surface 40 of the interconnect substrate 30.

In the following examples, which are illustrative and nonlimiting in scope, all parts are by weight unless otherwise specifically stated.

EXAMPLE 1

To demonstrate the concept of building alternating layers of thermoset and thermoplastic resins, a 20% solution in N-methyl pyrrolidinone (NMP) of preimidized polyimide thermoplastic resin ("Lenzing" P84) was knife coated to a wet thickness of 0.125 mm onto a silicon wafer and dried in an oven, for 15 minutes at 140° C. followed by 30 minutes at 300° C. to provide a dry thickness of about 22 μm.

Upon cooling, a 50% solution in cyclohexanone of a bismaleimide thermosetting resin ("Compimide" 183) was knife coated and subjected to the same temperature profile to dry the coating and crosslink the resin to a thermoset state at a dry thickness of about 25 μm.

Microscopic examination showed the resulting composite to have good adhesion and to be free from crazing, thus demonstrating the feasibility of building a multilevel interconnect substrate of alternating layers of thermoset and thermoplastic resins.

EXAMPLE 2

A composite was made in the same way as in Example 1 except 1) using a stainless steel base 0.1 mm in thickness without any polymeric coating, 2) building five layers of the thermoset resin alternated with four layers of the thermoplastic resin, and 3) allowing each layer to cool before covering it with the next resin layer.

Microscopic examination showed the resulting composite to have good adhesion and to be free from crazing, both before and after bending the composite around a 7.6 cm (3 inch) radius.

COMPARATIVE EXAMPLE A

A plurality of layers of the thermosetting resin of Example 1 were built on a stainless steel base identical to that of Example 2, and each layer was dried and crosslinked in the same manner as in Example 1 to a dry thickness of about 18 μm. This caused the stainless steel base to curl slightly, thus making it necessary to hold the composite flat before applying the next layer. After the seventh layer had been dried and crosslinked (total dry thickness of 0.125 mm), cracks appeared in the thermoset layers when the composite was flattened to apply to the eighth layer. Hence, the eighth layer was not applied. Upon being bent around a 7.6 cm this composite delaminated and shattered.

COMPARATIVE TEST B

A layer of the thermoplastic resin of Example 1 was coated onto a stainless steel base identical to that of Example 2 and dried as in Example 1 to a thickness of about 25 μm.

The application of a second layer of the thermoplastic resin solution crazed the underlying thermoplastic resin, so that this comparative test was discontinued.

EXAMPLE 3

A composite was made in the same manner as Example 2 except using a 55% solution in toluene of XU13005.02L benzocyclobutene from Dow Chemical, as the thermosetting resin. Microscopic examination showed the resulting composite to have good adhesion and to be free from crazing, both before and after bending the composite around a 3-inch (7.6-cm) radius.

EXAMPLE 4

A composite was made in the same manner as Example 2 except 1) using a 50% solution of toluene of "Thermid" FA7001 polyimide as the thermosetting resin, 2) building alternating layers of thermoset and thermoplastic resin until a total film thickness of 0.150–0.175 mm was obtained.

Microscopic examination showed the resulting composite to have good adhesion and to be free from crazing, both before and after bending the composite around a 3-inch (7.6 cm) radius.

EXAMPLE 5

A composite like that of Example 1 was built on a silicon wafer onto which had been sputtered a layer of chrome oxide having a thickness of 10–20 nm. Over this was spin coated a 20% NMP solution of preimidized polyimide thermoplastic resin ("Lenzing" P84). The coating was dried in an oven for 30 minutes at 55° C., 30 minutes at 140° C., and 30 minutes at 250° C. to a dry thickness of about 25 μm. After cooling, the surface of this thermoplastic resin layer was mechanically planarized to a thickness of 15 μm. This was overcoated by spin coating a 65% solution in cyclohexanone of a toughened bismaleimide thermosetting resin ("Compimide" 896) and subjected to the same temperature profile to dry the coating and crosslink the resin to a thermoset state. This coating had a dry thickness of about 25 ±m and was mechanically planarized to a thickness of 15 μm.

Additional layers of the same thermoplastic and thermosetting resins were applied in the same manner to provide two layers of the thermoset resin sandwiched between three layers of the thermoplastic resin.

Microscopic examination showed the resulting composite to have good adhesion and to be free from crazing.

EXAMPLE 6

A multilevel interconnect substrate like that shown in FIG. 3 can be built on a silicon wafer bearing a sputtered layer of chrome oxide 10–20 nm in thickness and a mechanically planarized layer of thermoplastic resin as in Example 5. Using an MCC 8801 mask set, onto the planarized face is built a Cu signal layer plus Cu vias using a copper pattern plate process. Over these Cu features a 65% solution in cyclohexanone of a toughened bismaleimide thermosetting resin ("Compimide" 896) is coated and heated in the same way as is Example 5. After allowing the coating to cool, the Cu features and thermoset resin are mechanically planarized to a thickness of 15 μm, thus providing a first level of metal-polymer composite. A second level of metal-polymer composite of the same thickness is built in the same manner except using a 20% NMP solution of preimidized polyimide thermoplastic resin ("Lenzing" P84). Over its planarized face is built a third level of metal-polymer composite identical in composition to the first, and the third level is mechanically planarized, thus providing interconnect substrate of the invention which includes a 3-level metal-polymer composite.

EXAMPLE 7

A composite like that of example 1 was built on a silicon wafer. A 50% MEK solution of a cyanate ester resin formulation (AroCy M50) was spin coated onto the silicon wafer and cured in an oven for 20 minutes at 55° C., 2 hours at 150° C., and 2 hours at 230° C. to a thermoset state. This coating had a dry thickness of about 25 μm. Upon cooling, a 20% solution in NMP of preimidized polyimide thermoplastic resin ("Lenzing" P84) was knife coated and subjected to the same temperature profile to dry the coating. An additional layer of thermosetting resin was applied in the same manner to provide a layer of thermoplastic resin sandwiched between two layers of thermoset resin. Microscopic examination showed the resulting composite to have good adhesion and be free from crazing.

What is claimed is:

1. An interconnect substrate comprising a metal-polymer composite incorporating microelectronic circuitry, which interconnect substrate is characterized by the feature that the polymer comprises alternating layers of thermoset and thermoplastic resins, said alternating layers having been built by solvent casting of one layer atop another layer, said thermoplastic resins being resistant to the highest temperature to which the interconnects substrate may be heated, said thermoset resins being selected from the group consisting of bismaleimides, thermosetting polyimides, polyimides, benzocyclobutenes and cyanate esters, said thermoplastic resins being selected from the group consisting of, polyesters including polyarylates, polyamides, polyvinylacetals, and phenoxy resins, said substrate having a durable base.

2. An interconnect substrate as defined in claim 1 wherein said metal-polymer composite is multilevel, and each level contains only one of said thermoset and thermoplastic resins.

3. An interconnect substrate as defined in claim 1 wherein said metal-polymer composite is multilevel, and each level comprises both a layer of thermoset resin and a layer of thermoplastic resin.

4. An interconnect substrate as defined in claim 3 wherein a layer of thermoplastic resin is located at the surface of each level.

5. An interconnect substrate as defined in claim 1 wherein said thermoset resin is a crosslinked bismaleimide.

6. An interconnect substrate as defined in claim 1 wherein said thermoset resin is a crosslinked cyanate ester.

7. An interconnect substrate as defined in claim 1 wherein said thermoplastic resin has a $T_g$ of at least 260° C.

8. An interconnect substrate as defined in claim 1 wherein said metal is copper.

\* \* \* \* \*